(12) United States Patent
Weis et al.

(10) Patent No.: US 11,094,780 B2
(45) Date of Patent: Aug. 17, 2021

(54) LATERAL SUPERJUNCTION TRANSISTOR DEVICE AND METHOD FOR PRODUCING THEREOF

(71) Applicant: Infineon Technologies Dresden GmbH & Co. KG, Dresden (DE)

(72) Inventors: Rolf Weis, Dresden (DE); Ahmed Mahmoud, Munich (DE)

(73) Assignee: Infineon Technologies Dresden GmbH & Co. KG, Dresden (DE)

(*) Notice: Subject to any disclaimer, the term of this patent is extended or adjusted under 35 U.S.C. 154(b) by 37 days.

(21) Appl. No.: 16/658,569

(22) Filed: Oct. 21, 2019

(65) Prior Publication Data

US 2020/0127087 A1    Apr. 23, 2020

(30) Foreign Application Priority Data

Oct. 23, 2018 (EP) .................................... 18202010

(51) Int. Cl.
*H01L 29/06* (2006.01)
*H01L 21/265* (2006.01)
(Continued)

(52) U.S. Cl.
CPC .... *H01L 29/0634* (2013.01); *H01L 21/26513* (2013.01); *H01L 21/324* (2013.01); *H01L 29/66681* (2013.01); *H01L 29/7816* (2013.01)

(58) Field of Classification Search
CPC ..... H01L 21/324; H01L 21/20; H01L 21/288; H01L 29/808; H01L 29/0692;
(Continued)

(56) References Cited

U.S. PATENT DOCUMENTS

| 6,566,709 B2* | 5/2003 | Fujihira | H01L 29/0619 257/266 |
| 2004/0082136 A1* | 4/2004 | Hutcheson | H01L 21/8249 438/350 |

(Continued)

FOREIGN PATENT DOCUMENTS

| WO | WO 0035020 A1 * | 1/1999 | ........... H01L 21/265 |
| WO | 0035020 A1 | 6/2000 | |

*Primary Examiner* — Galina G Yushina
(74) *Attorney, Agent, or Firm* — Murphy, Bilak & Homiller, PLLC

(57) ABSTRACT

A transistor arrangement and a method are disclosed. The transistor arrangement includes: a plurality of first semiconductor regions of a first doping type and a plurality of second semiconductor regions of a second doping type, the first semiconductor regions and the second semiconductor regions being arranged alternatingly in a vertical direction of a semiconductor body; a source region adjoining the plurality of first semiconductor regions; a drain region adjoining the plurality of second semiconductor regions and arranged spaced apart from the source region in a first lateral direction; and a plurality of gate regions each of which adjoins at least one of the plurality of second semiconductor regions and is arranged between the source region and the drain region. At least one of the first and semiconductor regions, but less than each of the first and second semiconductor regions has a doping dose that varies in the first lateral direction.

12 Claims, 12 Drawing Sheets

(51) Int. Cl.
*H01L 29/66* (2006.01)
*H01L 29/78* (2006.01)
*H01L 21/324* (2006.01)

(58) Field of Classification Search
CPC ........... H01L 29/0626; H01L 29/66484; H01L 29/7725; H01L 29/775; H01L 29/0634; H01L 29/66681; H01L 29/7816; H01L 29/1058; H01L 29/1066; H01L 29/66901
See application file for complete search history.

(56) References Cited

U.S. PATENT DOCUMENTS

2014/0227837 A1* 8/2014 Bobde ............... H01L 29/66484
438/192
2017/0092716 A1* 3/2017 Mauder ............... H01L 29/0696

\* cited by examiner

LATERAL SUPERJUNCTION TRANSISTOR DEVICE AND METHOD FOR PRODUCING THEREOF

TECHNICAL FIELD

This disclosure in general relates to a transistor arrangement, in particular a lateral superjunction transistor device.

BACKGROUND

A lateral superjunction transistor device includes a plurality of first semiconductor regions of a first doping type and a plurality of second semiconductor regions of a second doping, wherein each of the first regions and the second regions is arranged between a source region and a drain region. The first semiconductor regions are often referred to as drift regions and the second semiconductor regions are often referred to as compensation regions. A switching state (on or off) of the transistor device can be controlled by one or more gate regions.

In the off-state of the transistor device, a space charge region (depletion region) expands in the first and second semiconductor regions when a drain-source voltage is applied between the drain region and the source region. The space charge region is associated with an electric field, wherein an Avalanche breakdown may occur when the voltage is increased such that a field strength of the electric field reaches a critical value (which is often referred to as critical electrical field). In the case of an Avalanche breakdown a current (which is often referred to as Avalanche current) flows through the transistor device.

In a superjunction transistor device, the voltage blocking capability, which is the maximum voltage the transistor device can withstand in the off-state, inter alia is dependent on a ratio between the overall number of dopant atoms in the first semiconductor regions and the overall number of dopant atoms in the second semiconductor region, and is dependent on a distribution of these dopant atoms between the source region and the drain region. At a given on-resistance, which is the resistance between the source region and the drain region in the on-state of the transistor device, a maximum voltage blocking capability can be achieved by implementing the first and second semiconductor regions such that the overall number of dopant atoms in the first semiconductor regions and the overall number of dopant atoms in the second semiconductor region are essentially equal and that the dopant atoms in the first and second semiconductor regions are distributed in the same way. A transistor device of this type, however, has a low Avalanche robustness. That is, an Avalanche breakdown may cause the transistor device to be damaged or destroyed.

There is therefore a need for an Avalanche robust lateral superjunction transistor device, that is, a device that is capable of repeatedly withstanding an Avalanche breakdown.

SUMMARY

One example relates to a transistor arrangement. The transistor arrangement includes a plurality of first semiconductor regions of a first doping type and a plurality of second semiconductor regions of a second doping type, a source region adjoining the plurality of first semiconductor regions, a drain region adjoining the plurality of second semiconductor regions (120) and arranged spaced apart from the source region in a first lateral direction of a semiconductor body, and a plurality of gate regions. The first semiconductor regions and the second semiconductor regions are arranged alternatingly in a vertical direction of a semiconductor body. Each of the plurality of gate regions adjoins at least one of the plurality of second semiconductor regions and is arranged between the source region and the drain region. Further, at least one of the first and second semiconductor regions has a doping dose that varies in the first lateral direction and the remainder of the first and second semiconductor regions each have an essentially homogenous doping dose.

Another example relates to a method. The method includes forming a plurality of first semiconductor regions of a first doping type and a plurality of second semiconductor regions of a second doping type such that the first semiconductor regions and the second semiconductor regions are arranged alternatingly in a vertical direction of a semiconductor body, forming a source region adjoining the plurality of first semiconductor regions, forming a drain region adjoining the plurality of first and second semiconductor regions and arranged spaced apart from the source region in a first lateral direction of the semiconductor body, and forming a plurality of gate regions such that each of the plurality of gate regions adjoins at least one of the plurality of second semiconductor regions and is arranged between the source region and the drain region. Forming at least one of the first and second semiconductor regions includes forming the at least one of the first and semiconductor regions such that it has a varying doping dose in the first lateral direction, and forming a remainder of the first and second semiconductor regions such that each has an essentially homogenous doping dose.

Those skilled in the art will recognize additional features and advantages upon reading the following detailed description, and upon viewing the accompanying drawings.

DETAILED DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

FIGS. 1A-1C schematically illustrate a perspective sectional view (FIG. 1A), a vertical cross sectional view (FIG. 1B), and a horizontal cross sectional view (FIG. 1C) of a lateral superjunction transistor device;

DETAILED DESCRIPTION

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1A:
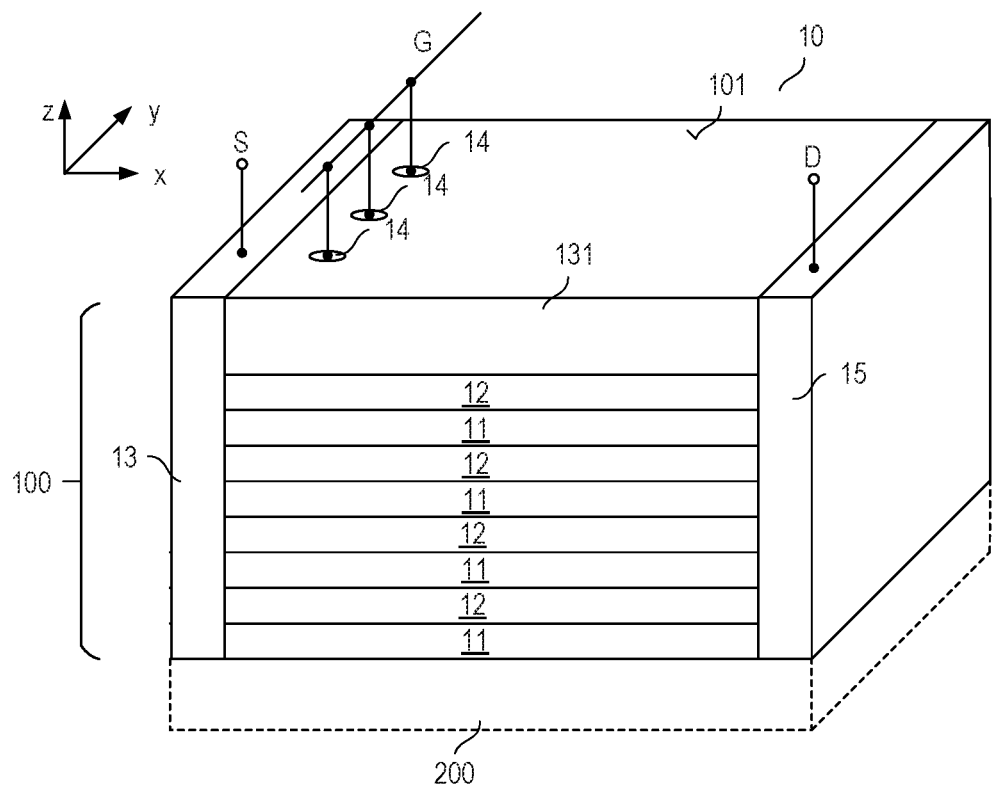
Figure 1B:
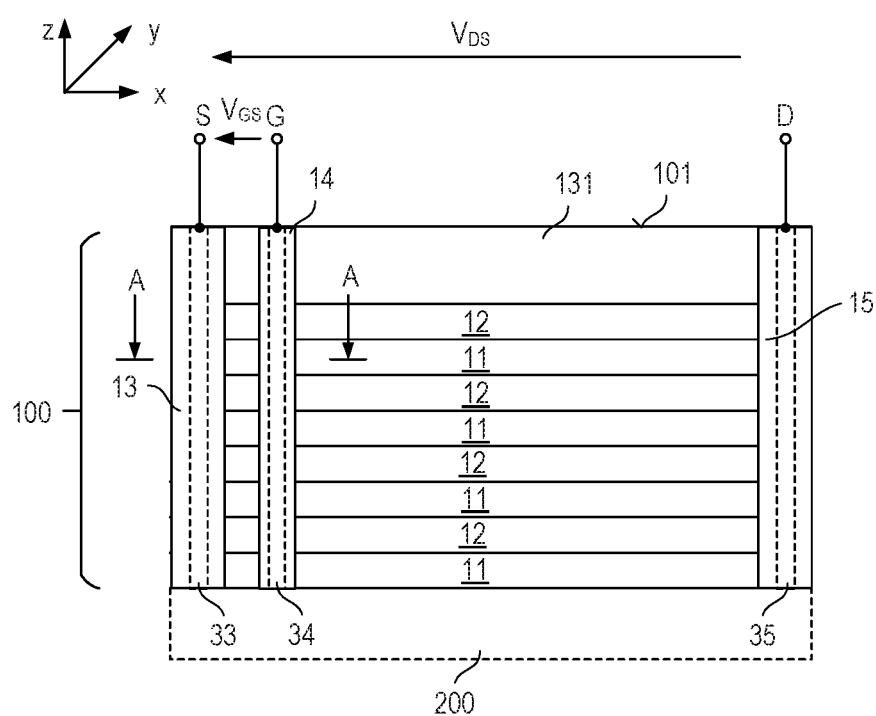
Figure 1C:
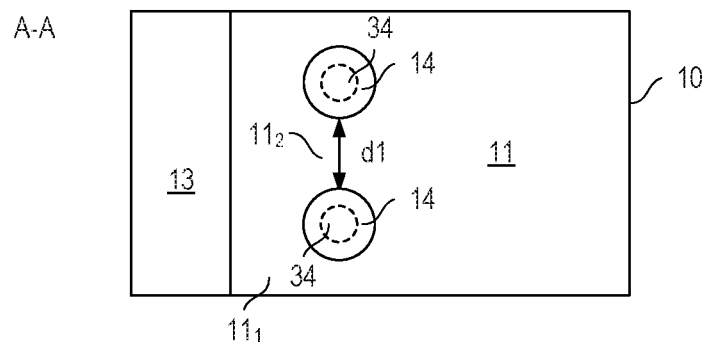

FIGS. 1A-1C show a perspective sectional view (FIG. 1A), a vertical cross sectional view (FIG. 1B), and a horizontal cross sectional view (FIG. 1C) of a transistor arrangement that includes a lateral superjunction transistor device 10. The transistor device 10 includes a plurality of first semiconductor regions 11 of a first doping type and a plurality of second semiconductor regions 12 of a second doping type. The first and second semiconductor regions are arranged alternatingly, and the second doping type is complementary to the first doping type. Each of a source region 13 and a drain region 15 adjoins each of the plurality of first semiconductor regions 11, wherein the drain region 15 is located spaced apart from the source region 13 in a first lateral direction x of a semiconductor body 100 in which the first and second semiconductor regions 11, 12, the source region 13, and the drain region 15 are arranged. Further, each of a plurality of gate regions 14 (a) adjoins at least one of the plurality of second semiconductor regions 12, (b) is arranged between the source region 13 and the drain region 15, and (c) is spaced apart from the first source region 13 and the first drain region 15.

As used herein, a region or layer of the first doping type is a layer or region with an effective doping of the first doping type. Such region or layer of the first doping type, besides dopants of the first doping type, may also include dopants of the second doping type, but the dopants of the first doping type prevail. Equivalently, a region or layer of the second doping type is a layer or region with an effective doping of the second doping type and may contain dopants of the first doping type.

Each of the first and second semiconductor regions 11, 12 has a length in the first lateral direction x and a thickness in a vertical direction of the semiconductor body 100 and further extends in a second lateral direction y. The "vertical direction z" is a direction perpendicular to a first surface 101 of the semiconductor body 100, and the "first and second lateral directions x, y" are directions parallel to the first surface 101. The first and second semiconductor regions 11, 12 may also be referred as semiconductor layers and the arrangement with the plurality of first and second semiconductor regions (layers) 11, 12 may also be referred to as layer stack or, shorter, stack.

The stack may extend to the first surface 101 so that one of the first and second semiconductor regions 11, 12 forms the first surface 101. Alternatively, a third semiconductor region (layer) 131 is arranged between the stack and the first surface so that the third semiconductor region 131 forms the first surface 101.

The semiconductor body 100 may include a conventional semiconductor material such as, for example, silicon (Si), silicon carbide (SiC), gallium nitride (GaN), gallium arsenide (GaAs), or the like. The semiconductor body 100 may be arranged on any kind of carrier 200 (illustrated in dashed lines in FIGS. 1A and 1B. Examples of this carrier 200 are explained herein further below.

According to one example, the overall number of first semiconductor regions 11 in the stack equals the overall number of second semiconductor regions 12. In the example shown in FIGS. 1A and 1B, an uppermost semiconductor region of the stack is a second semiconductor region 12 and a lowermost region is a first semiconductor region 11. The "uppermost semiconductor region of the stack" is the stack region that is closest to the first surface 101, and the lowermost semiconductor region is the stack region that is spaced apart from the uppermost layer most distantly. However, implementing the uppermost region as a second semiconductor region 12 and the lowermost region as a first semiconductor region 11 is only an example. According to another example (not shown) the uppermost region is a first semiconductor region 11 and the lowermost region is a second semiconductor region 12. Just for the purpose of illustration, in the example shown in FIGS. 1A-1C, the stack with the first and second semiconductor regions 11, 12 includes four first regions 11 and four second regions 12, so that the stack includes eight regions overall. This, however, is only an example. According to one example, the overall number of complementary regions 11, 12 in the stack is between 4 and 60, between 4 and 30, or between 6 and 20.

In the example illustrated in FIGS. 1A-1C, each of the source region 13 and the drain region 15 extends in the vertical direction z in the semiconductor body 100 such that each of the source region 13 and the drain region 15 adjoins each of the first regions 11 (and the second regions 12). Further, in this example, the gate regions 14 extend in the vertical direction z in the semiconductor body 100 so that each of the plurality of gate regions 14 adjoins each of the second semiconductor regions 12. The gate regions 14 are spaced apart from each other in the second lateral direction y. This second lateral direction y is different from the first lateral direction x and may be perpendicular to the first lateral direction x.

The lateral superjunction transistor device 10 illustrated in FIGS. 1A-1C is a depletion device, more specifically, a JFET (Junction Field-Effect Transistor). In this transistor device 10, each of the source region 13 and the drain region 15 is a region of the first doping type and each of the gate regions 14 is a region of the second doping type. Further, the first semiconductor regions 11 form drift regions and the second semiconductor regions 12 form compensation regions 12 of the superjunction device. The function of these drift and compensation regions 11, 12 is explained herein further below.

The transistor device can be implemented as an n-type transistor device or as a p-type transistor device, wherein the specific type is defined by the type of the first doping type. The first transistor device 10 is an n-type JFET when the first doping type is an n-type and the second doping type is a p-type. Equivalently, the first transistor device 10 is a p-type JFET when the first doping type is a p-type and the second doping type is an n-type.

According to one example, the source region 13, the drain region 15, the plurality of gate regions 14, the first and second regions 11, 12 forming the drift and compensation regions, and the optional third region 131 are monocrystalline semiconductor regions. According to one example, these regions include monocrystalline silicon (Si) and a doping concentration of the source region 13 and the drain region 15 is selected from a range of between 1E17 cm$^{-3}$ (=1·10$^{17}$ cm$^{-3}$) and 1E21 cm$^{-3}$, and a doping concentration of the gate regions 14 is selected from a range of between 1E17 cm$^{-3}$ and 1E21 cm$^{-3}$. Examples of the doping details of the first and second semiconductor regions 11, 12 are specified further below.

Referring to FIGS. 1A and 1B, the source region 13 is connected to a source node S, the gate regions 14 are connected to a gate node G, and the drain region 15 is connected to a drain node D. The source node S, the gate node G, and the drain node D are only schematically illustrated in FIGS. 1A and 1B. These nodes S, G, D may include metallizations (not shown) on top of the semiconductor body 100 or on the trench sidewalls. Optionally, as illustrated in dashed lines in FIG. 1B, a first electrode 33 may be embedded in the source region 13, second electrodes 34 may be embedded in the gate regions 14, and a third electrode 35 may be embedded in the drain region 35. The first electrode 33 is connected to the source node S and provides a low-ohmic connection between each section of the source region 13 and the source node S. The second electrodes 34 are connected to the gate node G and provide a low-ohmic connection between each section of the gate regions 14 and the gate node G. The third electrode 35 is connected to the drain node D and provides a low-ohmic connection between each section of the drain region 15 and the drain node D. Referring to FIG. 1B, each of the first, second and third electrodes 33, 34, 35 may extend along a complete length of the respective semiconductor region 14, 15, 13 in the vertical direction z. Alternatively, one or more of these electrodes 33, 34, 35 extends into the respective semiconductor region 13, 14, 15, but not entirely along the respective semiconductor region 13, 14, 15 in the vertical direction. Each of these electrodes 34, 35, 33 includes an electrically conducting material. Examples of such electrically conducting material include, but are not restricted to: a metal such as copper (Cu), aluminum (Al), tantalum (Ta), titanium (Ti), cobalt (Co), nickel (Ni) or tungsten (W); a highly doped polycrystalline semiconductor material such as polysilicon; or a metal silicide, such as tungsten silicide (WSi), titanium silicide (TiSi), Cobalt silicide (CoSi), or nickel silicide (NiSi).

The function of the lateral superjunction transistor device shown in FIGS. 1A-1C is explained below. Just for the purpose of explanation, it is assumed that the transistor device is an n-type JFET. In this case, the transistor device 10 is in an on-state (switched on state) when a voltage level of gate-source voltage $V_{GS}$ received between the gate node G and the source node S, is higher than a predefined threshold level $V_{th}$. That is, the transistor device 10 is in the on-state, when $V_{GS} > V_{th}$, where the threshold voltage $V_{th}$ is negative ($V_{th1} < 0$) in an n-type JFET. In the on-state, a current can flow between the source region 13 and the drain region 15 via the first regions (drift regions) 11 when a suitable voltage is applied between the drain node D and the source node S.

When the transistor device 10 is in the on-state and the gate-source voltage $V_{GS}$ decreases towards the threshold voltage $V_{th}$ p-n junctions between the first source region 13 and the compensation regions 12 and between the gate regions 14 and the drift regions 11 are becoming reverse biased. Furthermore, p-n junctions between the drift regions 11 and the compensation regions 12 are becoming reverse biased. Reverse biasing those p-n junctions causes the drift regions 11 to be depleted of charge carriers. The transistor device 10 switches off as soon as sections of the drift regions 11 between the at least two gate regions 14 and/or between the gate regions 14 and the source region 13 have been completely been depleted of charge carriers. The threshold voltage $V_{th}$ is the voltage at which the transistor device 10 switches off.

FIG. 1C shows a horizontal cross sectional view of one section of the transistor device 10 in a horizontal section plane A-A going through one of drift regions 11. The threshold voltage $V_{th}$ of the transistor device 10 is the voltage that needs to be applied between the gate regions 14 and the first source region 13 in order to completely deplete a first drift region section $11_1$ between the source region 13 and the gate regions 14 or second drift region sections $11_2$ between the gate regions 14. In FIG. 1C, d1 denotes a distance between two gate regions 14 in the second direction y.

The magnitude (the level) of the threshold voltage $V_{th}$ is dependent on several design parameters and can be adjusted by suitably designing these parameters. These design parameters include, for example, the (shortest) distance d1 between two gate regions 14, a doping concentration of the first drift region section $11_1$, a doping concentration of the second drift region sections $11_2$, and a doping concentration of the compensation regions 12 (out of view in FIG. 1C) in a section that is located between the gate regions 14.

A transistor device of the type illustrated in FIGS. 1A-1C can be produced such that each of the first and second semiconductor regions 11, 12 has an essentially homogeneous doping dose. The "doping dose" is the integral of the doping concentration of the respective semiconductor region in the vertical direction z. A first or second semiconductor region 11, 12 with a homogeneous doping dose can be produced, for example, by (1) epitaxially growing a semiconductor layer and in-situ doping the semiconductor layer during the epitaxial growth process; or (2) epitaxially growing an intrinsic semiconductor layer and implanting dopant atoms in a blanket (unmasked) implantation process into the semiconductor layer. In the latter case, an implantation dose used in the implantation process to form one of the first and second semiconductor regions equals the doping dose of the respective semiconductor region.

The first and second semiconductor region 11, 12 can be produced on a wafer level that is, a semiconductor wafer can be produced that includes a plurality of first semiconductor layers of the first doping type and a plurality of second semiconductor layers of the second doping type, wherein the first and second semiconductor layers are arranged alternatingly, and wherein each of the first and second semiconductor layers has an essentially homogeneous doping dose. Based on such wafer a plurality of transistor devices can be produced by forming source regions, gate regions and drain regions. The voltage blocking capability of the individual transistor devices can be adjusted by suitably selecting a distance between the source and drain regions 13, 15.

Figure 2:
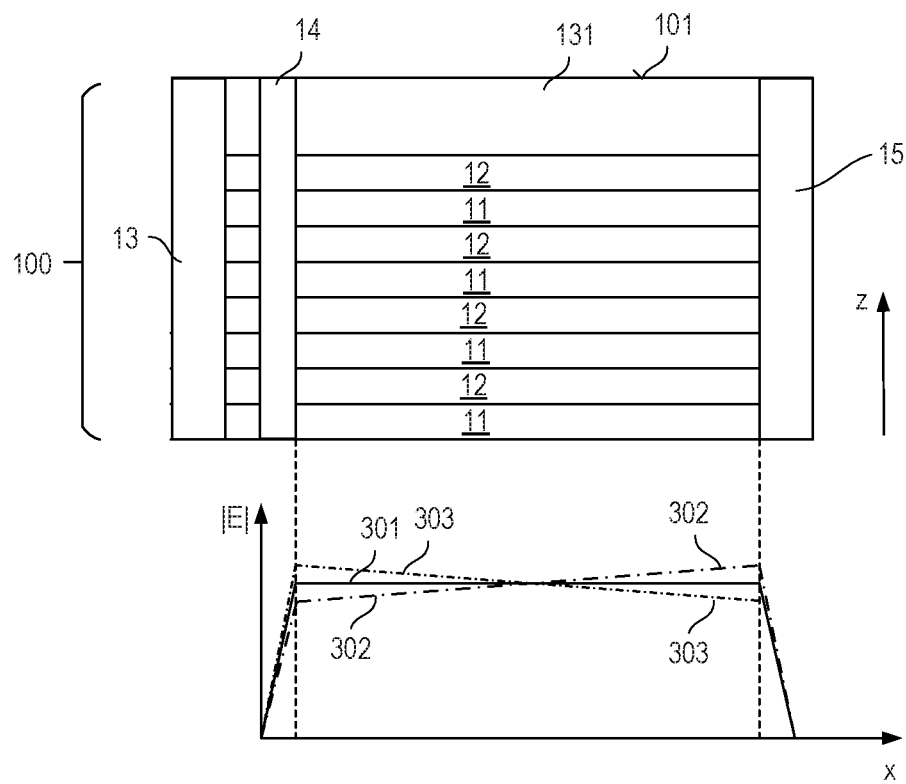
FIG. 2 illustrates an example of a behavior of the electric field in a lateral superjunction transistor device having first and second semiconductor regions with a homogenous doping dose.

The first and second semiconductor regions 11, 12 might be produced such that the first semiconductor regions 11 and the second semiconductor regions 12 are essentially balanced with regard to their doping doses. That is, the first semiconductor regions 11 essentially have the same doping dose as the second semiconductor regions 12. "Essentially balanced" means that there may be an imbalance of up to +/−10%. That is, there may be 10% more or less dopant atoms in the drift regions 11 than in the compensation regions 12. FIG. 2 illustrates the magnitude |E| of an electric field occurring between the gate regions 14 and the drain region 15 when the transistor device is in the off-state and a drain-source voltage $V_{DS}$ (see FIG. 1B) is applied between the drain node D and the source node S. The illustration in FIG. 2 is based on the assumptions that (1) the transistor device is a n-type transistor device, that is, the drift regions 11 are n-type regions and the compensation regions 12 are p-type regions; (2) each of the drift and compensation regions 11, 12 has an essentially homogeneous doping dose, that is, the doping dose is essentially the same at each horizontal position of the respective region; and (3) the doping is essentially balanced, that is, the overall number of n-type dopants in the drift regions 11 essentially equals the overall number of p-type dopants in the compensation regions 12.

In FIG. 2, curve 301 represents a scenario in which the doping is exactly balanced, that is, the overall number of n-type dopant atoms in the drift regions 11 exactly equals the overall number of p-type dopant atoms in the compensation regions 12. In this case, the magnitude of the electric field is essentially constant between the gate regions 14 and the drain region 15. Curve 302 represents a scenario in which the overall number of p-type dopant atoms in the compensation regions 12 is higher than the overall number of n-type dopant atoms in the drift regions 13. In this case, the magnitude of the electric field increases towards the drain region 15 and has a maximum at a border to the drain region 15. Curve 303 illustrates a scenario in which the overall number of n-type dopant atoms in the drift regions 11 is higher than the overall number of p-type dopant atoms in the compensation regions 12. In this case, the electric field has a maximum close to the gate regions 14 and decreases towards the drain region 15.

The curves 301, 302, 303 shown in FIG. 2 illustrate the electric field for three different doping scenarios but for the same drain-source voltage $V_{DS}$. The drain-source voltage $V_{DS}$ is essentially given by the integral of the electric field (which is equivalent to the area below the curves 301, 301, 303 in FIG. 2). A breakdown occurs, when the drain-source voltage is increased such that the magnitude of the electric field reaches a critical value, which is between 2E5 V/cm and 3E5 V/cm in silicon. The voltage blocking capability is given by the integral of the magnitude of electric field (the area below curves 301-303) when the magnitude of the electric field reaches the critical value. The voltage blocking capability of a transistor device implemented in accordance with the doping details underlying curve 301 is higher than the voltage blocking capabilities of transistor devices implemented in accordance with the doping details underlying curves 302 and 303. This can be seen from curves 301-303 in that the area below curve 301 is greater than the areas below curves 302, 303 when the maximum of the magnitude of the electric field equals the critical value. (Or, in other words, at a given drain-source voltage $V_{DS}$ the maximum of the electric field according to curve 301 is lower than the maximum of the electric field according to each of curves 302 and 303.)

Each of the scenarios illustrated in FIG. 2 is undesirable in view of an avalanche robustness of the transistor device. A lateral superjunction transistor device in accordance to one of curves 301-303 is prone to a snapback when an Avalanche breakdown occurs. This is illustrated in FIG. 3.

Figure 3:
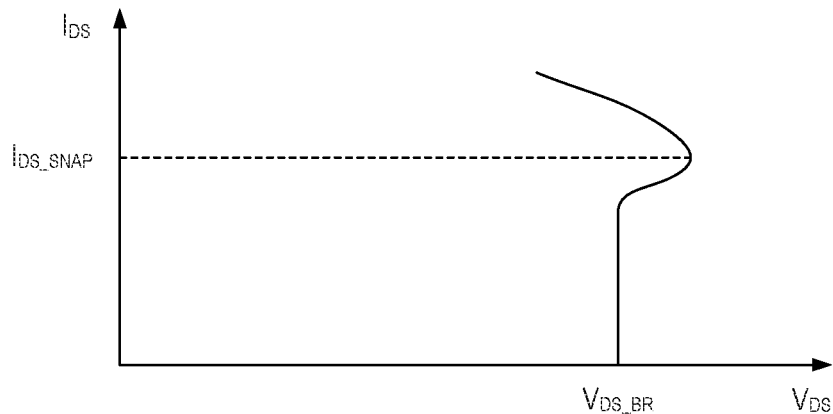
FIG. 3 illustrates the drain-source voltage of a transistor device of the type illustrated in FIG. 2 when an Avalanche breakdown occurs.

FIG. 3 illustrates a drain-source current $I_{DS}$, which is the current between the drain region 15 and the source region 14 dependent on the drain-source voltage $V_{DS}$. In this example, a drain-source current $I_{DS}$ sets in when the drain source voltage $V_{DS}$ reaches a breakdown voltage $V_{DS\_BR}$ (which defines the voltage blocking capability). Further, the drain-source voltage $V_{DS}$ is constant or increases as the drain-source current $I_{DS}$ increases and is below a snapback value $I_{DS\_SNAP}$. When the drain-source current $I_{DS}$ reaches the snapback value, however, the drain-source voltage $V_{DS}$ decreases as the current $I_{DS}$ further increases. The operation state in which the drain-source voltage $V_{DS}$ decreases as the current $I_{DS}$ further increases is highly unstable and may result in a destruction of the transistor device.

When an Avalanche breakdown occurs charge carrier pairs are produced at a position in the transistor device at which the magnitude of the electric field reaches the critical value. These charge carriers, by impact ionization, generate further charge carrier pairs. Each carrier pair includes an electron and a hole wherein, in an n-type transistor device, holes flow to the source region 14 and electrons flow to the drain region 15. These charge carriers and the fact that the magnitude of the electric field decreases at the position where the Avalanche breakdown sets in might cause a shift of the electric field such that the maximum occurs at another position and causes an Avalanche breakdown there. Avalanche breakdowns of the transistor device might occur at multiple positions due to such shift of the electric field in context with a snapback behavior.

It is therefore desirable to design a lateral superjunction transistor device such that a snapback is prevented or that the snapback value $I_{DS\_SNAP}$ is shifted to a value that is outside a current range that may occur when the transistor device is operated in an Avalanche mode. The "Avalanche mode" is an operating mode in which the transistor device is operated such that an Avalanche breakdown occurs. The Avalanche mode is typically not intended in applications but may occur in special cases during operation like commutation of an inductive load connected in series with the transistor device, wherein an Avalanche current, that is, the drain-source current flowing in the Avalanche mode is defined by the load.

Figure 4:
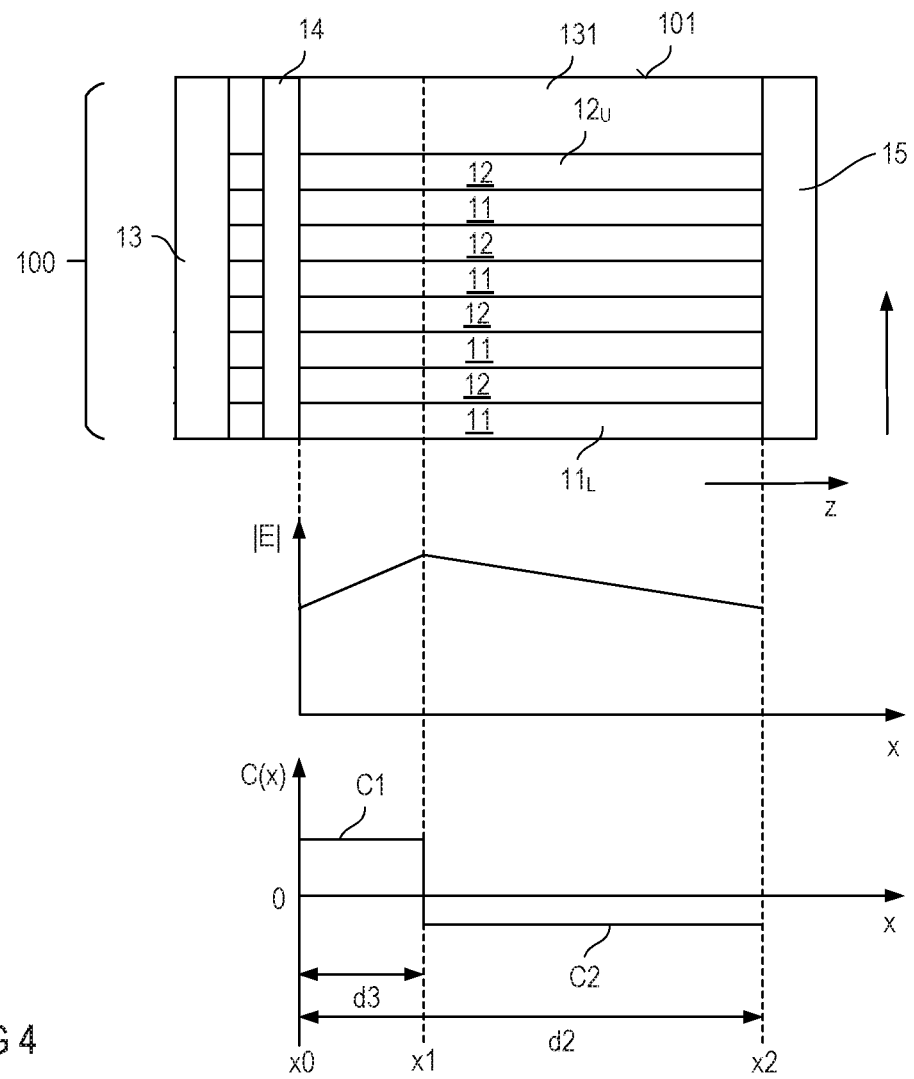
FIG. 4 illustrates an example of a behavior of the electric field in a lateral superjunction transistor device having at least one first or second semiconductor region with a varying doping dose.

FIG. 4 illustrates the magnitude of the electric field in a lateral superjunction transistor device with a higher Avalanche robustness. In this transistor device, a maximum of the magnitude |E| of the electric field, in the off-state of the transistor device, occurs at a lateral position that is located between the gate regions 14 and the drain region 15 and that is spaced apart from the gate regions 14 and the drain region 15. In FIG. 4, x0 denotes a lateral position of a border between the gate regions 14 and the drift and compensation regions 11, 12, x2 denotes a lateral position of the border between the drain region 15 and the drift and compensation regions 11, 12, and x1 denotes the lateral position at which the maximum of the electric field occurs. This position x1 is referred to as "maximum position" in the following.

As can be seen from FIG. 4, the maximum position x1 is spaced apart from the gate region 14 and the drain region 15. Referring to FIG. 4, this can be obtained by implementing the drift regions 11 and the compensation regions 12 such that a degree of compensation C(x) varies in the first lateral direction x such that the degree of compensation C(x) changes its sign at the maximum position x1. Just for the purpose of illustration it is assumed that the transistor device is an n-type transistor device. In this case, the drift regions 11 and the compensation regions 12 are implemented such that the degree of compensation C(x) is positive between the gate regions 14 and the maximum position x of the maximum and is negative between the position x1 of the maximum and the drain region 15. The degree of compensation C(x) is given by:

$$C(x) = 2 \cdot \frac{\sum_{i=1}^{n} D12_i(x) - \sum_{j=1}^{m} D11_j(x)}{\sum_{i=1}^{n} D12_i(x) + \sum_{j=1}^{m} D11_j(x)}. \quad (1)$$

The compensation regions 12 can be numbered from 1 through n, wherein $D12_i(x)$ denotes the doping dose of an i-th compensation region, and the drift regions 11 can be numbered from 1 through m, wherein $D11_j(x)$ denotes the doping dose of an j-th drift region. More specifically, $D12_i(x)$ denotes the doping dose of the i-th compensation regions 12 at the lateral position x, $D11_j(x)$ denotes the doping dose of the j-th drift regions 11 at the lateral position x. Further, n denotes the overall number of compensation regions 12, and m denotes the overall number of drift regions 11. Referring to the above, the doping dose of one of the drift and compensation regions 11, 12 at a certain lateral position x represents the number of dopant atoms included in the respective drift or compensation region 11, 12 at the respective lateral position x. Thus, the term $\Sigma_{i=1}^{n}D12_i(x)$ represents the overall number of dopant atoms in the plurality of the compensation regions 12 at a given position x, and $\Sigma_{j=1}^{m}D11_j(x)$ represents the overall number of dopant atoms in the plurality of the drift regions 11 at a respective lateral position x.

FIG. 4 shows a vertical cross sectional view of the transistor device in a section plane that is parallel to the vertical direction z and the first lateral direction x. Further, $D11_i(x)$ and $D12_j(x)$ as mentioned above denote the doping dose of an arbitrary one $11_i$ of the drift regions 11 at a position x and the doping dose of an arbitrary one $12_j$ of the compensation regions 12 at a position x. The "dopant dose" of one of the drift and compensation regions is given by the number of dopant atoms per area unit of the respective drift or compensation region. For the purpose of illustration it is assumed that the doping dose at a specific first lateral position x is the same at each point of the device having this first lateral position x, that is, there is no variation of the doping dose in the second lateral direction y.

As can be seen from equation (1), the degree of compensation C(x) is zero when, at a given lateral position x, the overall number of dopant atoms in the compensation regions 12 equals the overall number of dopant atoms in the drift region 11. The degree of compensation C(x) is positive, when the overall number of dopant atoms in the compensation regions 12 is higher than the overall number of dopant atoms in the drift regions 11. Further, the degree of compensation C(x) is negative, when the overall number of dopant atoms in the compensation regions 12 is lower than the overall number of dopant atoms in the drift regions 11.

Referring to FIG. 4, the degree of compensation C(x) may be essentially constant between the gate regions 14 and the maximum position x1 and may be essentially constant between the maximum position x1 and the drain region 15. In the example illustrated in FIG. 4, C1 denotes the degree of compensation between the gate regions 14 and the maximum position x1, and C2 denotes the degree of compensation between the maximum position x1 and the drain region 15. According to one example, C1*(x1−x0) and C2*(x2−x1) have the same magnitude, |C1*(x1−x0)|=|C2*(x2−x1)|. In this case, the transistor device is exactly balanced. That is, the overall number of dopant atoms of the first type in the drift regions 11 equals the overall number of dopant atoms of the second type in the compensation regions. According to another example, the magnitude of one of C1*(x1−x0) and C2*(x2−x1) is greater than the magnitude of the other one of C1*(x1−x0) and C2*(x2−x1), wherein, according to one example, the magnitude of the difference C1*(x1−x0)−C2*(x2−x1) is less than 30%.

According to one example, the maximum position x1 is closer to the gate regions 14 than to the drain region 15. This equivalent to d3<0.5 d2, where d2 is the (shortest) distance between the gate regions 14 and the drain region 15 and d3 is the (shortest) distance between the gate regions 15 and the maximum position. According to one example, 0.1*d2<d3<0.4*d2.

According to one example, a degree of compensation behavior as illustrated in FIG. 4 is obtained by implementing at least one of the drift and compensation regions 11, 12 but less than each of the drift regions 11 and less than each of the compensation regions 12 such that the doping dose varies in the first lateral direction x. Each of the remainder of the drift and compensation regions 11, 12 can be implemented such that the doping dose is essentially homogenous, that is, essentially does not vary in the first lateral direction x. Various examples of how a degree of compensation behavior as illustrated in FIG. 4 can be obtained are explained with reference to FIGS. 5-7 in the following. According to one example, "essentially homogenous" means that a minimum doping dose and a maximum doping dose deviate less than 10%, less than 5%, or even less than 1% from an average doping dose.

Figure 5:
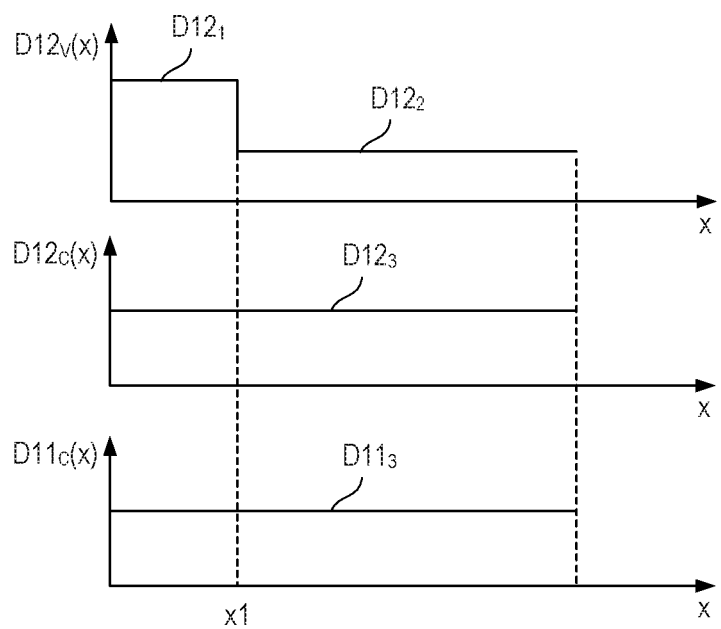
FIGS. 5-7 illustrate different examples of homogenous and varying doping doses.

According to one example, at least one of the compensation regions has a varying doping dose $D12_V(x)$ such that the doping dose has a first value $D12_1$ between the gate regions 14 and the maximum position x1 and a second value $D12_2$ between the maximum position x1 and the drain region 15, wherein the first value $D12_1$ is higher than the second value $D12_2$. In this example, the remainder of the compensation regions have a homogeneous doping dose $D12_C(x)$ such that the doping dose is essentially the same at each horizontal position. In FIG. 5, $D12_C(x)$ represents the doping dose profile of one of the compensation regions 12 having a homogenous doping dose, wherein $D12_3$ denotes the constant doping dose value of the homogeneous doping dose. This constant value $D12_3$ can be the same for each of the compensation regions having a homogeneous doping dose. This, however, is only an example. It is also possible that different compensation regions with homogeneous doping dose have different constant doping dose values $D12_3$.

Further, in the example illustrated in FIG. 5, the drift regions 11 have a homogeneous doping dose as represented by the doping dose profile $D11_C(x)$ illustrated in FIG. 5. In FIG. 5, $D11_3$ denotes the constant doping dose of one of the drift regions with homogeneous doping dose. This constant value $D11_3$ can be the same for each of the drift regions 11. According to another example, different drift regions have different constant values $D11_3$ of the doping dose.

Figure 6:
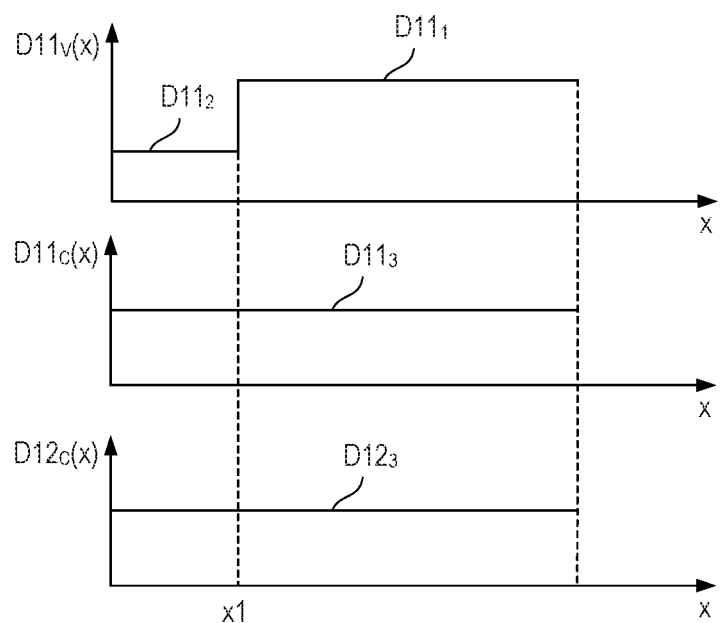

According to another example illustrated in FIG. 6, at least one of the drift regions has a varying doping dose profile $D11_V(x)$ such that the doping dose has a first value $D11_1$ between the maximum position x1 and the drain region 15 and a second value $D11_2$ lower than the first value $D11_1$ between the maximum position x1 and the gate regions 14, wherein the first value $D11_1$ is higher than the second value $D11_2$. The remainder of the drift regions 11 have a homogeneous doping profile $D11_C(x)$ as already explained with reference to FIG. 5. Further, in this example, the compensation regions 12 have a homogeneous doping profile $D11_C(x)$ as already explained with reference to FIG. 5.

According to another example illustrated in FIG. 7, at least one of the compensation regions but less than each of the compensation regions 12 has a varying doping dose profile $D12_V(x)$ as explained with reference to FIG. 5, at least one of the drift regions 11 but less than each of the drift regions 11 has a varying doping dose profile $D11_V(x)$ as explained with reference to FIG. 6, while the remainder of the compensation regions 12 have a homogeneous doping dose profile $D11_C(x)$ and the remainder of the compensation regions 12 have a homogeneous doping dose profile $D12_C(x)$.

Figure 7:
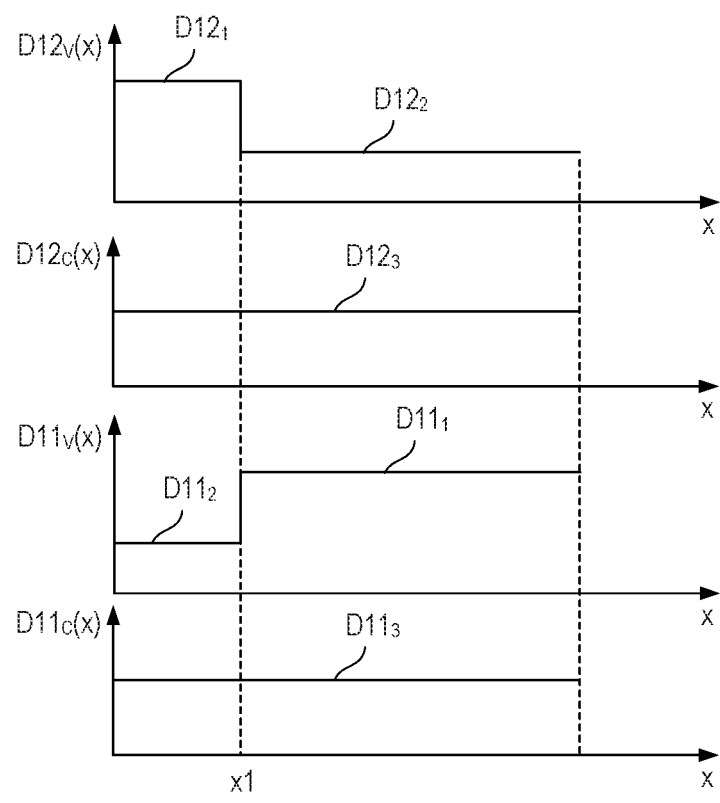

According to one example, in the methods illustrated in FIGS. 5 to 7, $D12_1$ is between 1.1 times and 2 times $D12_2$ ($1.1*D12_2 \leq D12_1 \leq 2*D12_2$), and $D11_1$ is between 1.2 times and 2 times $D11_2$ ($1.1*D11_2 \leq D11_1 \leq 2*D11_2$). According to one example, $D11_1$ and/or $D12_1$ are between 2E12 cm$^{-2}$ and 5E12 cm$^{-2}$.

Further, according to one example, the first and second semiconductor regions having a an essentially homogenous doping dose profile have essentially the same doping doses, that is, $D12_3=D11_3$. According to one example, $D12_3$ and $D11_3$ are between 1E12 cm$^{-2}$ and 4E12 cm$^{-2}$.

Referring to the above, in one transistor device, one or more compensation regions 12 can be implemented with a varying doping dose and the drift regions 11 can be implemented with a homogenous doping dose, one or more drift regions 11 can be implemented with a varying doping dose and the compensation regions 12 can be implemented with a homogenous doping dose, or one or more compensation regions 12 and one or more drift regions 11 can be implemented with a varying doping dose. In each case, according to one example, less than 50% of the drift regions 11 and less than 50% of the compensation regions 12 are implemented with a varying doping dose.

Various examples of where the at least one drift or compensation region 11, 12 with the varying doping dose profile is located in the layer stack are explained with reference to FIGS. 8A-8D in the following. Each of these Figures schematically illustrates the layer stack with the plurality of drift regions 11 and the plurality of compensation regions 12 and illustrates which of the semiconductor regions in the layer stack is implemented with the varying doping dose profile. The semiconductor region that has the varying doping dose profile is labeled with $D11_V(x)$ or $D12_V(x)$ in these Figures. The remainder of the semiconductor regions have a homogeneous doping dose profile. According to one example, the at least one semiconductor region with the varying doping dose is spaced apart from a lowermost semiconductor region and an uppermost semiconductor region of the layer stack. In FIGS. 8A-8D, $11_L$ denotes the lowermost semiconductor region and $12_U$ denotes the upper most semiconductor region in the layer stack.

The lowermost semiconductor region $11_L$ is a first semiconductor region 11 and the uppermost semiconductor region $12_U$ is a second semiconductor region 12. This, however, is only an example. It is also possible to implement the uppermost semiconductor region as a first semiconductor region and the lowermost semiconductor region as a second semiconductor region.

Figure 8A:
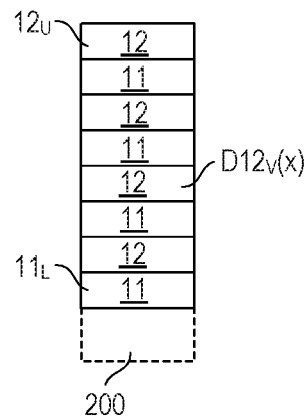
FIGS. 8A-8D illustrate different examples of where a first or second semiconductor region with a varying doping dose may be located in the lateral superjunction transistor device.
Figure 8B:
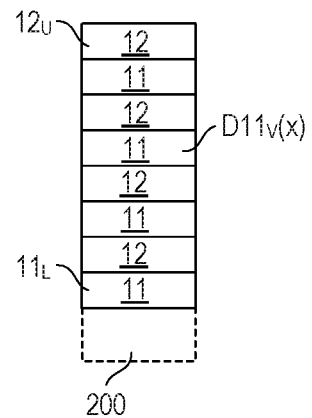

In the example illustrated in FIG. 8A, one of the compensation regions 12 has a varying doping dose profile, and in the example shown in FIG. 8B one of the drift regions has a varying doping dose profile. In each of these examples, there is only one semiconductor region with a varying doping dose profile. This, however, is only an example. In the example shown in FIG. 8A more than one of the compensation regions can be implemented with a varying doping dose profile and in the example illustrated in FIG. 8B, more than one of the drift regions 11 can be implemented with a varying doping dose profile wherein. In each of these examples, the semiconductor regions with the varying doping dose are different from the lowermost semiconductor region $11_L$ and the uppermost semiconductor region $12_U$ in the layer stack.

Figure 8C:
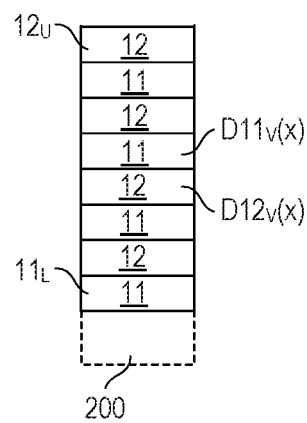
Figure 8D:
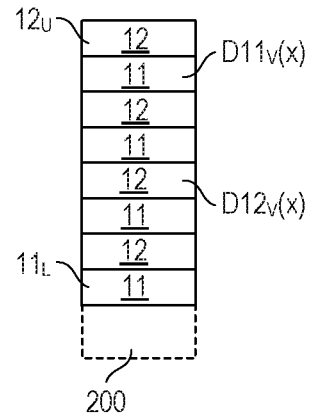

In the example illustrated in FIG. 8C, one of the drift regions 11 is implemented with a varying doping dose profile $D11_V(x)$ and one of the compensation regions 12 is implemented with a varying doping dose profile $D12_V(x)$. In this example, the drift region 11 with the varying doping dose profile adjoins the compensation region with the varying doping dose profile. This, however, is only an example. According to another example illustrated in FIG. 8D, one or more semiconductor regions with a homogeneous doping dose profile are located between the two regions with the varying doping dose profile. According to one example, the semiconductor regions with the varying doping dose profile are different from the uppermost and lowermost semiconductor regions $12_U$, $11_L$ in the layer stack.

In the examples shown in FIGS. 8A to 8C the remainder of the first and second semiconductor regions, that is, those first and second semiconductor regions not labelled with $D11_V(x)$ or $D12_V(x)$ have an essentially homogenous doping dose, wherein the doping doses of those regions having a homogenous doping dose may be essentially equal. According to one example, each of the remainder of the first and second semiconductor regions except for the lowermost region $11_L$ and the uppermost region $12_U$ have a homogenous doping dose profile and essentially the same doping dose value. The uppermost region $12_U$ and the lowermost region $11_L$ may have a homogenous doping dose profile with a doping dose value that is about 50% of the doping dose value of the other semiconductor regions with homogenous doping dose profile. Optionally or additionally, a semiconductor region adjoining the at least one semiconductor region with the varying doping dose profile may have a homogeneous doping dose profile with a doping dose value that is lower than the doping dose values of the other semiconductor regions with homogenous doping dose profile (except for the uppermost and the lowermost region). This is explained herein further below.

FIG. 4 illustrates the degree of compensation profile of the overall transistor device. Implementing the transistor device in accordance with one of the examples illustrated in FIGS. 5 to 7 has the effect, that the degree of compensation profile of a certain pair of drift and compensation regions has the form of the overall degree of compensation profile C(x) as illustrated in FIG. 4. This certain pair of drift and compensation region includes (a) a compensation region with varying doping does profile $D12_V$ and an adjoining drift region with a homogenous doping dose profile $D11_C$; (b) a drift region with the varying doping does profile $D11_V$ and an adjoining compensation region with a homogenous doping dose profile $D12_C$; or (c) a compensation region with varying doping does profile $D12_V$ and an adjoining drift region with a varying doping dose profile $D11_V$. Other pairs of drift and compensation regions that include a drift region with a homogenous doping dose profile $D11_C$ and a compensation region with a homogenous doping does profile $D12_C$ have a degree of compensation profile that is essentially constant, wherein the degree of compensation is zero when the adjoining drift and compensation regions have the same doping dose, $D11_C=D12_C$.

Further, FIG. 4 illustrates an average of the magnitude of the electric field in the individual pairs of drift and compensation regions 11, 12. More specifically, at a certain lateral position x, the electric field may vary in the vertical position z. Assume, for example, that there is a certain pair of drift and compensation regions in which the drift region and/or the compensation region has a varying doping concentration and that in the other pairs of drift and compensation regions the doping dose profiles are homogenous. In this case, in the certain pair of drift and compensation regions the electric field has the form of the overall electric field illustrated in FIG. 4, wherein the electric field in the other pairs is essentially constant. This has the effect, that the Avalanche breakdown, at first, occurs at the maximum position x1 in the certain pair of drift and compensation regions. Further, by implementing the drift and compensation regions of this certain pair such that there is a step in the degree of compensation profile, the lateral position of the Avalanche breakdown is essentially pinned to the maximum position x1. In other words, the maximum of the electric field is essentially pinned to the maximum position x1 in the first lateral direction. Nevertheless, at the maximum position x1, the electric field may vary in the vertical direction z.

Referring to the above a degree of compensation profile as illustrated in FIG. 4 can be obtained by implementing, in a pair of adjoining drift and compensation regions, one of the drift and compensation regions with a varying doping dose and the other one of the drift and compensation regions with a homogenous doping dose. The doping dose of the drift or compensation region with the homogenous doping dose can be the same as the doping doses of the remainder of the drift and compensation regions or can be lower, such as between 10% and 50% lower.

Figure 9A:
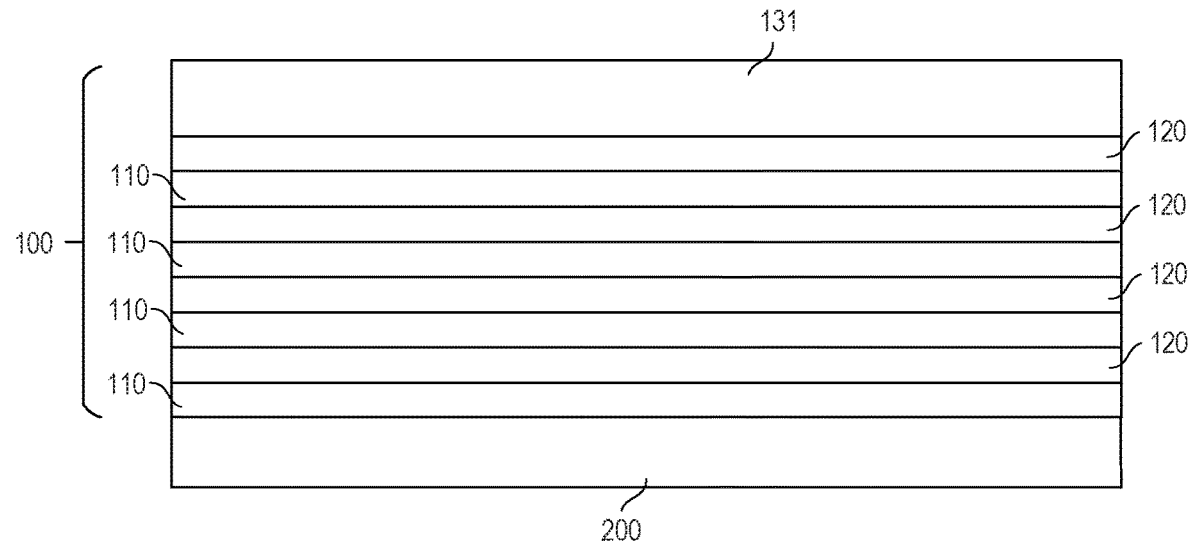
FIGS. 9A and 9B illustrate one example of a method for forming a lateral superjunction transistor device.
Figure 9B:
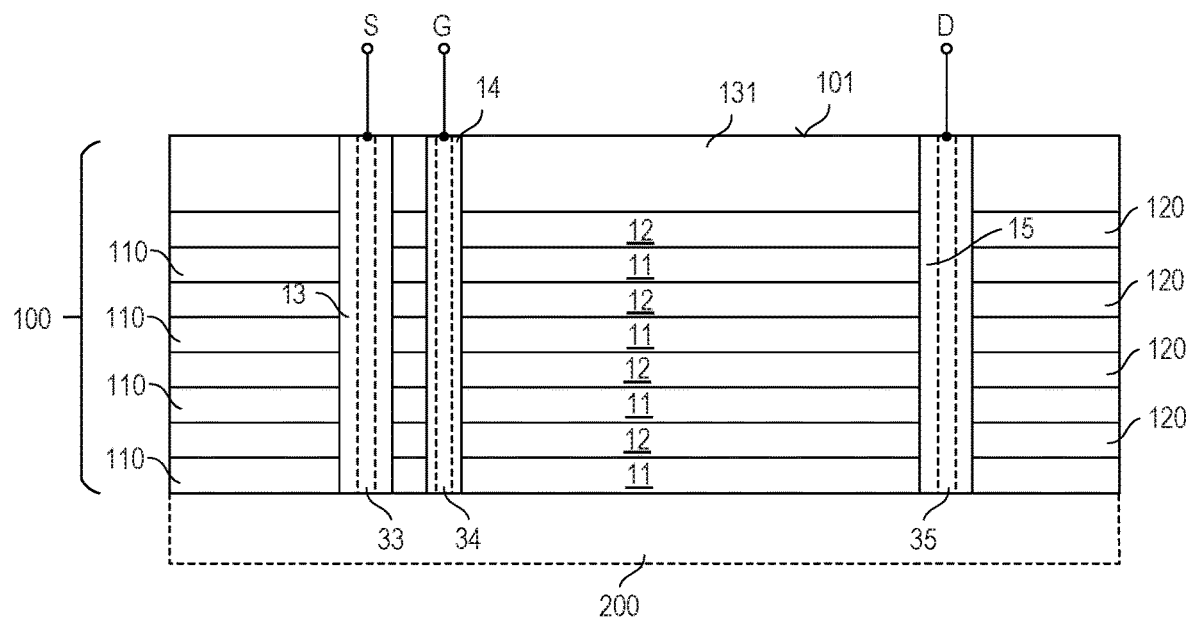

FIGS. 9A and 9B basically illustrate one example of a method for producing a transistor device of the type explained herein before. Referring to FIG. 9A, the method includes forming a plurality of first semiconductor layers 110 and second semiconductor layers 120 such that these first and second semiconductor layers 110, 120 are arranged alternatingly on top of a carrier 200. FIG. 9A illustrates the layer stack with the plurality of a first and second semiconductor layers 110, 120 after forming these semiconductor layers on top of the carrier 200. Examples for forming these semiconductor layers are explained further below.

The method further includes forming the source region 13, the gate regions 14 and the drain region 15 in the layer stack. FIG. 9B shows a vertical cross sectional view of the layer stack after forming the source region 13, the gate regions 14 and the drain region 15. Forming each of these regions may include forming a trench extending from the first surface 101 through the layer stack down to the carrier 200 and introducing dopant atoms via sidewalls of these trenches into the layer stack in order to form the respective region, that is the source region 13, the gate regions 14 and the drain region 15. In the transistor device, those sections of the first semiconductor layers 110 that are arranged between the source region 12 and the drain region 15 form the drift regions 11, and those sections of the second semiconductor layers 120 that are arranged between the source region 12 and the drain region 15 form the compensation regions 12. Thus, the doping doses of the first and second semiconductor regions 11, 12 are defined by the doping doses of the first and second semiconductor layers in the respective sections.

Referring to FIGS. 9A and 9B, an optional third layer 131 can be formed on top of the layer stack. Details on this optional layer are outlined below.

Referring to the above, at least some of the drift regions 11 and at least some of the compensation regions 12 have a homogeneous doping dose. Thus, at least some of the first semiconductor layers 110 and at least some of the second semiconductor layers 120 are formed such that they have a homogeneous doping dose. Examples for forming one or more semiconductor layers with a homogeneous doping dose are explained in the following.

Figure 10A:
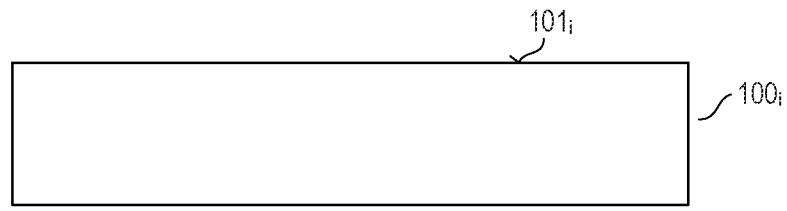
FIGS. 10A-10D illustrate one example of a method for forming first and second semiconductor layers with a homogenous doping dose.

According to one example illustrated in FIGS. 10A-10D, the method includes epitaxially growing a semiconductor layer $100_i$. This semiconductor layer is referred to as epitaxial layer in the following. A vertical cross sectional view of the epitaxial layer $100_i$ is illustrated in FIG. 10A. A carrier onto which the epitaxial layer $100_i$ has been grown, is not illustrated in FIG. 10A. This carrier can be a carrier of the type illustrated in FIGS. 1A and 1B that, in the finished device, carries the layer stack with the first and second regions 11, 12, or this carrier can be another epitaxial layer grown before growing the epitaxial layer $100_i$. The epitaxial layer $100_i$ can be intrinsic or can have a basic doping concentration of one of the first and second doping type.

Figure 10B:
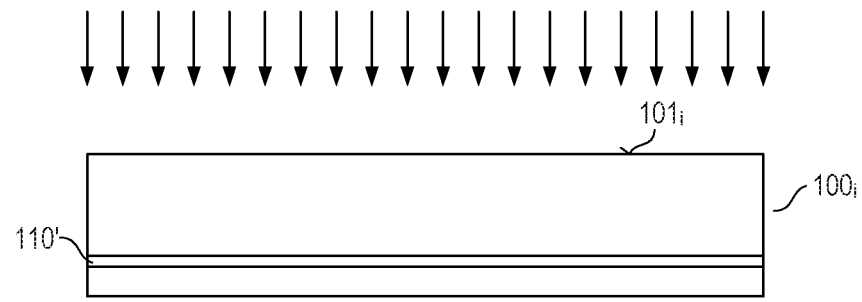
Figure 10C:
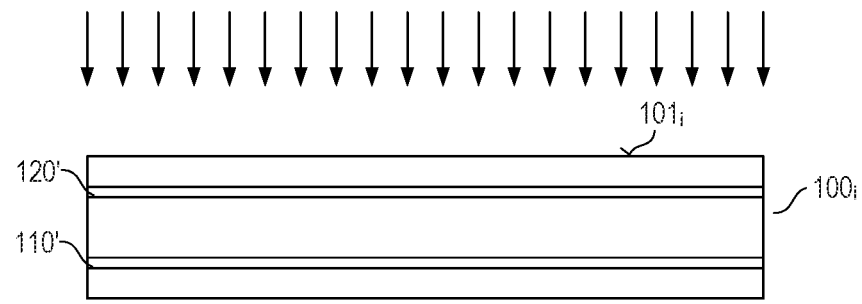
Figure 10D:
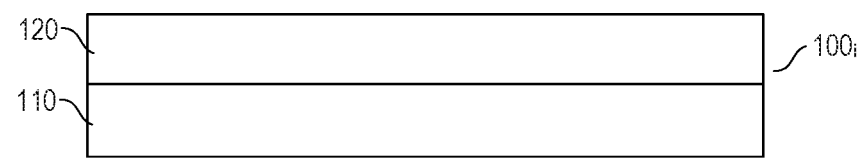

Referring to FIGS. 10B and 10C, the method further includes blanket implanting dopant atoms of the first doping type into a surface $101_i$ of the semiconductor layer $100_i$, in order to form a first implanted region 110' at a predefined vertical position of the epitaxial layer $100_i$. The "vertical position" is a position in a direction perpendicular to a surface $101_i$ of the epitaxial layer $100_i$. The implanted region 110' is essentially parallel to the surface $101_i$. The vertical position of the implanted region 110' is dependent on an implantation energy, wherein the higher the implantation energy the greater is a distance between the surface $101_i$ and the implanted region 110'. According to one example, the first type doping atoms are n-type atoms and the semiconductor layer $100_i$ includes monocrystalline silicon. The n-type doping atoms are phosphorous (P) atoms, for example.

Referring to FIG. 10C, the method further includes forming a second implanted region 120' by blanket implanting dopant atoms of the second doping type into the surface $101_i$. The implantation energy in this implantation process may be such that the second implanted region 120' is formed at a vertical position different from the vertical position of the first implanted region 110'. Just for the purpose of illustration, in the example illustrated in FIGS. 10B and 10C, the second implanted region 120' is formed closer to the surface $101_i$ than the first implanted region 110'.

The first implanted regions 110' include first type dopant atoms and the second implanted regions 120' include second type dopant atoms. In order to activate these dopant atoms a thermal process is performed. In this thermal process, the implanted dopant atoms are activated by incorporating the doping atoms into the crystal lattice of the epitaxial layer $100_i$, so as to form a first semiconductor layer of the first doping type 110 from the first implanted region 110' and second semiconductor layer 120 of the second doping type from the second implanted region 120'. The doping dose of the first semiconductor layer 110 is given by the implantation dose used in the implantation process illustrated in FIG. 10B in which the first implanted region 110' is formed. Equivalently, the doping dose of the second semiconductor layer 120 is given by the implantation dose in the implantation process illustrated in FIG. 10C in which the second implanted region 120' is formed.

The method illustrated in FIGS. 10A-10D can be performed several times in order to form a plurality of first semiconductor layers 110 and a plurality of second semiconductor layers 120 one above the other. That is, after the second implantation process a further epitaxial layer (not shown) can be formed on the surface $101_i$ and first and second implanted regions can be formed in this further semiconductor layer in accordance with the methods illustrated in FIGS. 10B and 10C. According to one example, one thermal process is used to activate the dopant atoms in each of the implanted regions. That is, several epitaxial layers can be formed one on top of the other, first and second implanted regions are formed in each of these epitaxial layers before forming a next one of these epitaxial layers, and one thermal process is performed after each-of these epitaxial semiconductor layers has been formed and after implantation regions have been formed in each of these epitaxial layers. Further, growing an epitaxial layer may include a thermal process so that growing an epitaxial layer may activate dopant atoms implanted in epitaxial layers grown before.

Just for the purpose of illustration, in the example illustrated in FIGS. 10A-10C, two implanted regions are formed in one epitaxial layer $100_i$. This, however, is only an example. According to another example (not shown) only one implanted region is formed in one epitaxial semiconductor layer before forming a next one of the intrinsic semiconductor layers. According to another example, more than two implanted regions are formed in one epitaxial layer $100_i$.

Figure 11A:
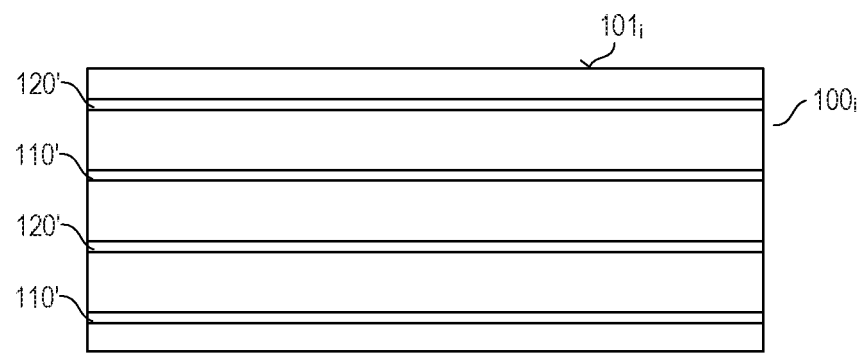
FIGS. 11A and 11B illustrate a modification of the method illustrated in FIGS. 10A-10D.
Figure 11B:
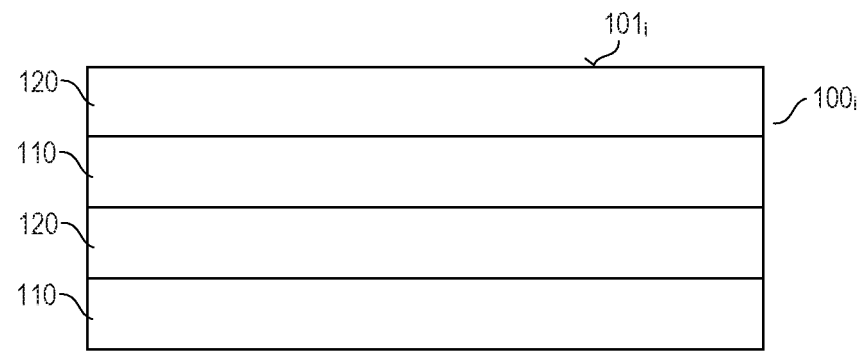

FIGS. 11A-11B illustrates an example of an epitaxial layer in which four implanted regions, two first implanted regions 110' and two second implanted regions 120' have been formed. Forming each of these implanted regions 110', 120' includes a respective implantation process of the type illustrated in one of FIG. 10B or 10C. The first and second implanted regions 110', 120' are formed alternatingly so that, after the thermal process, two first semiconductor layers 110 and two semiconductor layers 120 that are arranged alternatingly are formed. FIG. 11B shows the semiconductor 100, after the thermal process.

According to another example (not illustrated) a first semiconductor layer 110 or a second semiconductor layer 120 with a homogeneous doping dose can be formed by epitaxially growing the semiconductor layer and in-situ doping in the semiconductor layer during the epitaxial growth process.

Examples for forming a first or second semiconductor layer 110, 120 with a varying doping dose are explained with reference to FIGS. 12 to 15 below. Basically, forming a first or second semiconductor layer 110, 120 with a varying doping dose includes an implantation process in which dopant atoms are selectively implanted into an epitaxial layer. "Selectively implanted" includes forming an implantation mask on top of the epitaxial layer and implanting dopant atoms into those sections of the surface that are not covered by the implantation mask, wherein the implantation mask prevents dopant atoms from being implanted into those sections of the surface covered by the implantation mask.

Figure 12:
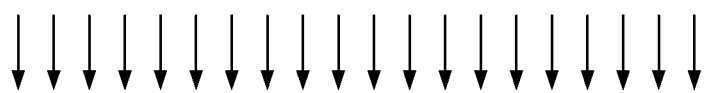
FIGS. 12-15 illustrate different examples for forming a first or second semiconductor layer with a varying doping dose.
Figure 12:
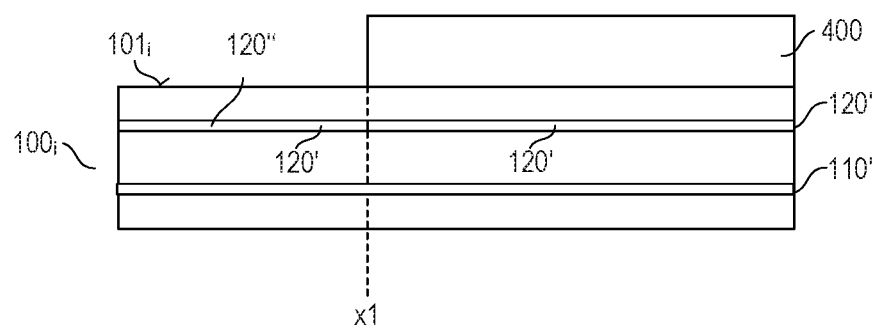

FIG. 12 illustrates one example of a masked implantation process that is used to form a second semiconductor layer with a varying doping dose. In this example, the masked implantation process is performed after a second implanted region 120' has been formed in the epitaxial layer 100; in accordance with the method explained with reference to FIG. 10C. This, however, is only an example. The masked implantation process could also be performed before performing the blanket implantation that generates the second implanted region 120'.

Referring to FIG. 12, the implantation mask 400 is formed on the surface $101_i$ of the intrinsic semiconductor layer $100_i$ and dopant atoms of the second doping type are implanted into the surface $101_i$ into those sections of the surface $101_i$ not covered by the implantation mask 400. According to one example, the implantation mask 400 is positioned on the surface $101_i$ such that the dopant atoms are implanted into sections which, in the finished semiconductor device are located between the gate regions 14 and the desired maximum region x1. Implanting the second type dopant atoms forms a further implanted region 120', wherein the dopant atoms of this further implanted region 120" add to the dopant atoms included in the second implanted region 120'. After the thermal process (not illustrated) the second semiconductor region 120, in those sections resulting from the first implanted region 120' and the further implanted region 120", has a doping dose that is given by the implantation dose used for forming the implanted region 120' and the implantation dose used for forming the further implanted region 120". The same type of dopant atoms can be used to form the second implanted region 120' and the further implanted region 120". Further, the implantation energy can be the same in each of these implantation processes.

Figure 13:
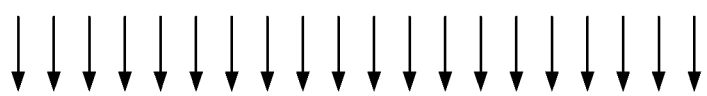
Figure 13:
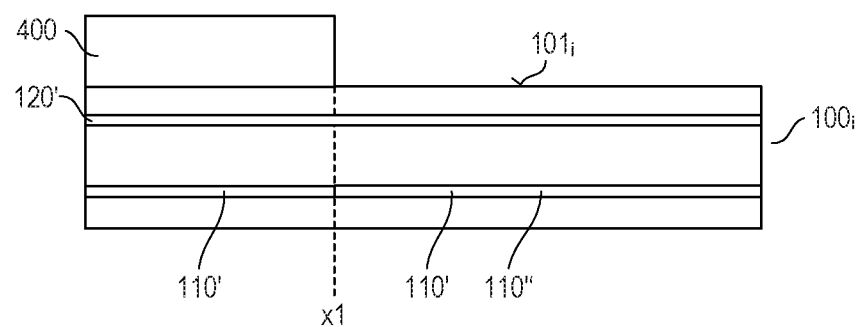

A first semiconductor layer 110 with a varying doping dose can be formed by a method equivalent to the method explained with reference to FIG. 12. Referring to FIG. 13, forming a first semiconductor layer 110 with a varying doping dose may include forming a first implanted region 110' including dopant atoms of the first doping type by a blanket implantation process and forming a further implanted region 110" including dopant atoms of the first doping type by a masked implantation process using an implantation mask 400. The first implanted region 110' can be formed before or after the further implanted region 110". Referring to FIG. 13, in this process, the implantation mask 400 is positioned on the surface $101_i$ such that the dopant atoms are implanted into those sections which, in the finished device, are located between the maximum position and the drain region 15.

In each of the examples illustrated in FIGS. 12 and 13, a semiconductor layer with a varying doping dose is formed from a first or second implanted region 110', 120' formed by a blanket implantation process. A first or second semiconductor region 11, 12 formed by this semiconductor layer has a doping dose profile $D12_V(x)$ or $D11_V(x)$ as explained with reference to FIGS. 5 to 7. The implantation doses used to form the first implanted region 110' of a first semiconductor layer 110 with varying doping dose and the implantation dose used to form a first semiconductor layers 110 with a homogenous doping dose can be equal. In case, $D11_2$ and $D11_3$ in FIGS. 6 and 7 are essentially equal. According to another example, the implantation dose used to form the first implanted region 110' of a first semiconductor layer 110 with varying doping dose is lower than the implantation dose used to form the first implanted region 110' of a first semiconductor layer 110 with a homogenous doping. In this case, $D11_2$ in FIGS. 6 and 7 is lower than $D11_3$.

Equivalently, the implantation doses used to form the second implanted region 120' of a second semiconductor layer 120 with varying doping dose and the implantation dose used to form a second semiconductors layers 120 with a homogenous doping dose can be equal. In this case, $D12_2$ and D12₃ in FIGS. 6 and 7 are essentially equal. According to another example, the implantation dose used to form the second implanted region 120' of a second semiconductor layer 120 with varying doping dose is lower than the implantation dose used to form the second implanted region 120' of a second semiconductor layer 120 with a homogenous doping. In this case, D12₂ in FIGS. 5 and 7 is lower than D12₃.

Figure 14:
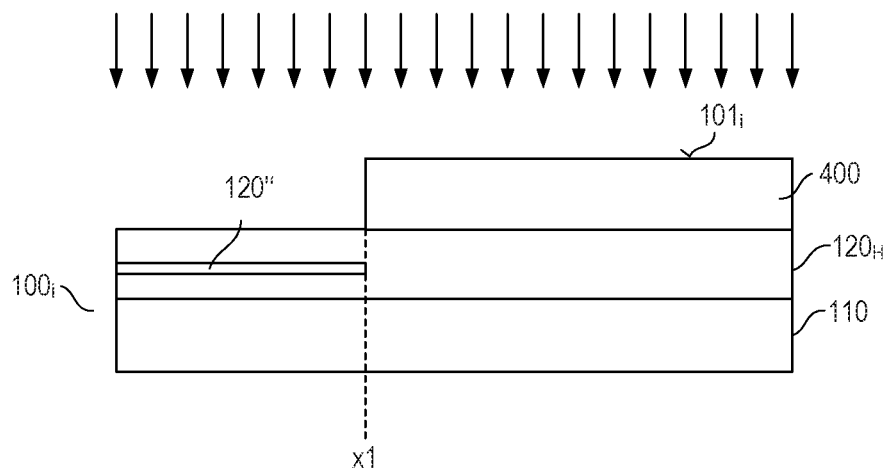

FIG. 14 illustrates another example of a method for forming a second semiconductor layer 120 with a varying doping dose. In this example, a second semiconductor layer $120_H$ with a homogeneous doping dose has been formed by an epitaxially growth process. Further, an implanted region 120" corresponding to the implanted region 120" explained with reference to FIG. 12 is formed in the second semiconductor layer $120_H$ by an implantation process of the type explained with reference to FIG. 12. After forming the implanted region 120" a thermal process is performed in order to activate the implanted dopant atoms. The result of the thermal process is a second semiconductor layer 120 with a varying doping dose.

Figure 15:
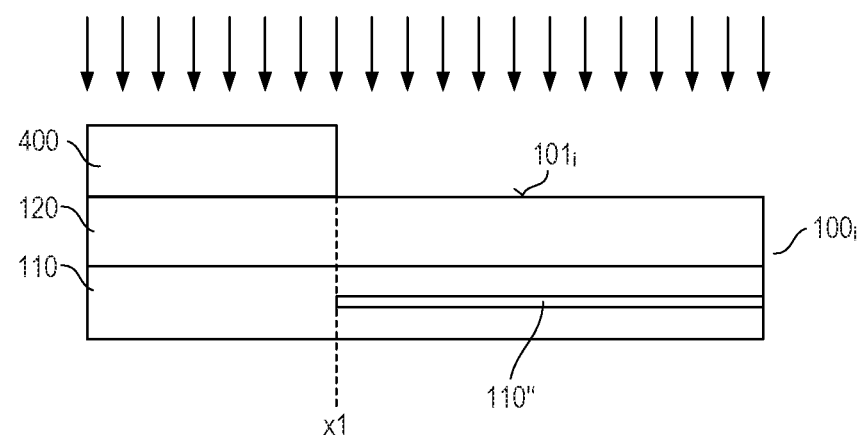

FIG. 15 illustrates another example of a method for forming a first semiconductor layer 110 with a varying doping dose. In this example, a first semiconductor layer $110_H$ with a homogeneous doping dose is produced by an epitaxial growth process and an implanted region 110" corresponding to the further implanted region 110" explained with reference to FIG. 13 is formed by a masked implantation process in this semiconductor layer $110_H$.

Referring to the above the layer stack with the first and second semiconductor regions 11, 12 can be formed on top of a carrier 200. According to one example, the carrier 200 includes an electrically insulating material such as glass, an oxide, or the like.

Figure 16:
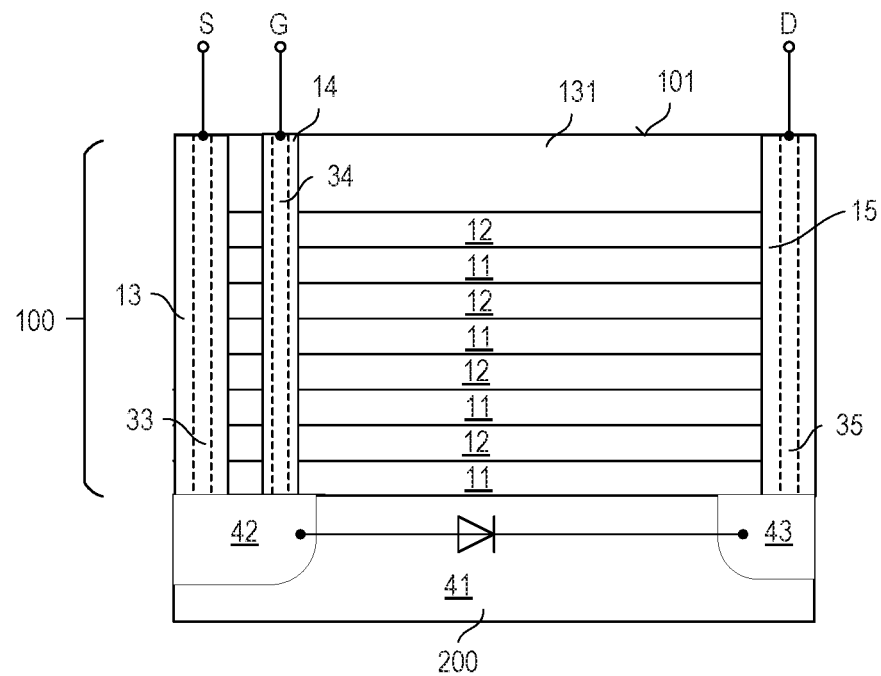
FIG. 16 illustrates a transistor device of the type illustrated in FIGS. 1A-1C that additionally includes a diode in a substrate below the first and second semiconductor regions.

According to another example illustrated in FIG. 16, the carrier 200 is a semiconductor substrate having a basic doping of one of the first and second doping type. According to one example, the carrier 200 has a basic doping of the second doping type and the gate regions 14 and the drain region 15 extends through the layer stack down to the carrier 200. In order to prevent a short circuit between the gate regions 14 and the drain region 15 a pn-junction is formed in the carrier 200 between the drain region 15 and the gate regions 14. More specifically, a diode having a first emitter region 42 that adjoins the gate regions 14 and the second emitter region 43 that adjoins the drain region 15 is formed in the substrate 200. Further, a base region 41 of this diode is formed by a section of the carrier 200 having the basic doping concentration of the carrier 200. The first emitter region 42 has the same doping type as the gate regions 14, and the second emitter region 43 has the same doping type as the drain region 15. According to one example, the base region has the same doping type as the first emitter region 42. In this case, a pn-junction is formed between the base region 41 and the second emitter region 43. According to one example, doping concentrations of the basic doping of the carrier 200 and the first and second emitter regions 42, 43 are selected such that a voltage blocking capability of the diode formed in the carrier 200 between the drain region 15 and the gate region 14 is higher than the voltage blocking capability of the transistor device. In this way, an avalanche breakdown, at first, occurs in the layer stack spaced apart from the carrier 200.

Figure 17:
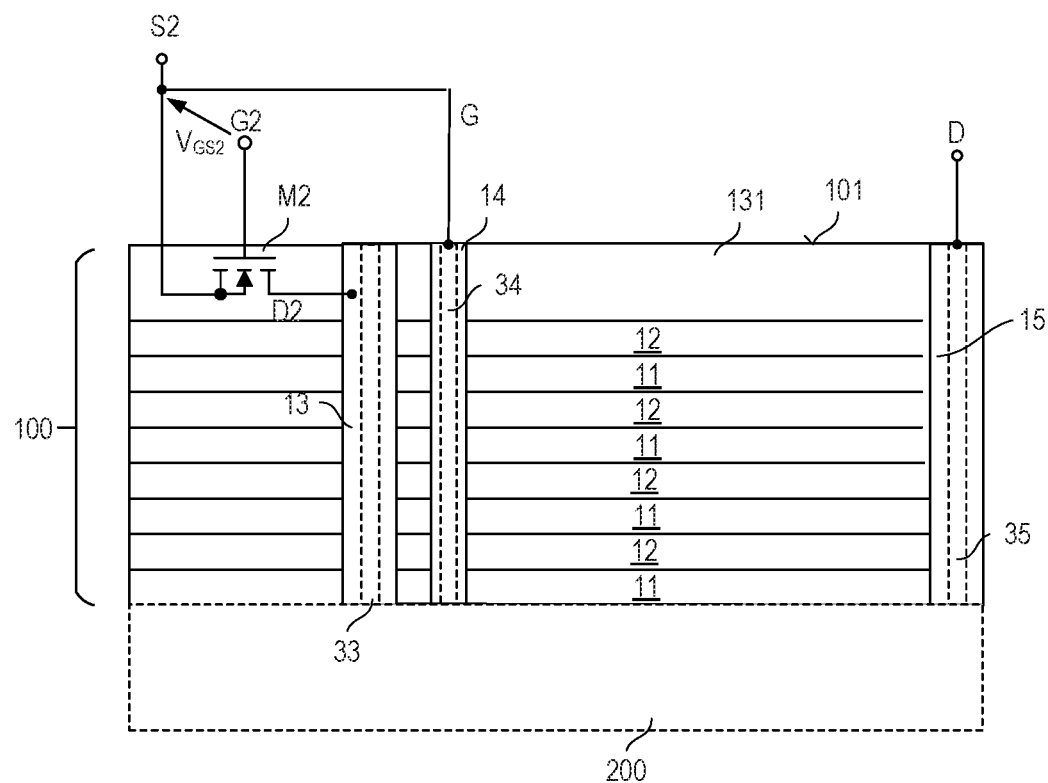
FIG. 17 illustrates a transistor arrangement with a transistor device of the type illustrated in FIGS. 1A-1C and a further transistor device.

According to one example illustrated in FIG. 17, a further transistor device M2 is integrated in the third semiconductor layer 131. According to one example, this further transistor device is an enhancement MOSFET, wherein a drain D2 of this MOSFET is connected to the source region 13 of the lateral superjunction transistor device, a source S2 of this further transistor device M2 is connected to the gate region 14 of the lateral superjunction transistor device. The lateral superjunction transistor device, which is a depletion device, and the further transistor device M2, which is an enhancement device, form a cascode circuit that can be controlled (switched on or off) by applying a drive voltage (gate-source voltage) between a gate node G2 and the source node S2 of the further transistor device M2. This cascode circuit can be operated like one single transistor. An operation state of the cascode circuit is defined by an operation state of the enhancement MOSFET M2, wherein the cascode circuit switches on or off dependent on a drive voltage $V_{GS2}$ received between the second gate node G2 and the second source node S2. A cascode circuit of this type is known, so that no further explanations are required in this regard. Further, the further transistor device M2 can be integrated in the third semiconductor layer 131 in a conventional way.

According to one example, the third semiconductor layer 131, in the section between the source region 13 and the drain region 15 a doping of the second doping type (the same doping type as the gate regions 14) so that a first p-n junction is formed between the drain region 15 and the third region 131 and a second p-n junction is formed between the source region 13 and the third layer 131. These p-n junctions are part of two bipolar diodes, a first bipolar diode formed by the gate regions 14, the third layer 131 and the first drain region 15, and a second bipolar diode formed by the gate regions 14, the third layer 131 and the first source region 13. In each of these bipolar diodes, the third layer 131 forms a base region. According to one example, a doping concentration of the third region 131 is such that a voltage blocking capability of the first bipolar diode is equal to or higher than a voltage blocking capability of the transistor device 10.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof

What is claimed is:

1. A transistor arrangement, comprising:
    a plurality of first semiconductor regions of a first doping type and a plurality of second semiconductor regions of a second doping type, wherein the first semiconductor regions and the second semiconductor regions are arranged alternatingly in a vertical direction of a semiconductor body;
    a source region adjoining the plurality of first semiconductor regions;
    a drain region adjoining the plurality of second semiconductor regions and arranged spaced apart from the source region in a first lateral direction; and
    a plurality of gate regions, each of the plurality of gate regions adjoining at least one of the plurality of second semiconductor regions and being arranged between the source region and the drain region,
    wherein at least one of the first and second semiconductor regions has a doping dose that varies in the first lateral direction, and wherein a remainder of the first and second semiconductor regions each has an essentially homogenous doping dose,
wherein the doping dose of the at least one of the first and second semiconductor regions is such that the doping dose has an essentially constant first value between the gate regions and a first position and an essentially constant second value, different from the first value, between the first position and the drain region,
wherein the first position is closer to the gate regions than to the drain region.

2. The transistor arrangement of claim 1, wherein more than 50% of the first semiconductor regions and more than 50% of the second semiconductor regions have an essentially homogenous doping dose.

3. The transistor arrangement of claim 1, wherein $0.1 \cdot d2 < d3 < 0.4 \cdot d2$, where d2 is the distance between the gate regions and the drain region and d3 is the distance between the gate regions and the first position.

4. The transistor arrangement of claim 1, wherein a maximum of the first and second values is between 1.2 times and 2 times a minimum of the first and second values.

5. The transistor arrangement of claim 1, wherein the plurality of first semiconductor regions and the plurality of second semiconductor regions comprise an uppermost semiconductor region and a lowermost semiconductor region, and wherein the at least one of the first and semiconductor regions is spaced apart from the uppermost semiconductor region and the lowermost semiconductor region.

6. The transistor arrangement of claim 1, wherein the plurality of the first and second semiconductor regions comprises an adjoining semiconductor region adjoining the at least one of the first and semiconductor regions, wherein the adjoining semiconductor region has a homogenous doping dose lower than a homogenous doping dose of at least one other of the first and second semiconductor regions that is spaced apart from the at least one of the first and semiconductor regions.

7. The transistor arrangement of claim 1, wherein a number of first semiconductor regions equals a number of second semiconductor regions, and wherein the number is between 3 and 60.

8. The transistor arrangement of claim 1, wherein a dimension of each of the first and second semiconductor regions in the vertical direction is between 0.5 micrometers and 2 micrometers.

9. The transistor arrangement of claim 1, further comprising:
a transistor device integrated in the semiconductor body and having a load path connected between the source region and the drain region.

10. A transistor arrangement, comprising:
a plurality of first semiconductor regions of a first doping type and a plurality of second semiconductor regions of a second doping type, wherein the first semiconductor regions and the second semiconductor regions are arranged alternatingly in a vertical direction of a semiconductor body;
a source region adjoining the plurality of first semiconductor regions;
a drain region adjoining the plurality of second semiconductor regions and arranged spaced apart from the source region in a first lateral direction; and
a plurality of gate regions, each of the plurality of gate regions adjoining at least one of the plurality of second semiconductor regions and being arranged between the source region and the drain region,
wherein at least one of the first and second semiconductor regions has a doping dose that varies in the first lateral direction, and
wherein a remainder of the first and second semiconductor regions each has an essentially homogenous doping dose,
wherein the doping dose of the at least one of the first and second semiconductor regions is such that the doping dose has an essentially constant first value between the gate regions and a first position and an essentially constant second value, different from the first value, between the first position and the drain region,
wherein a maximum of the first and second values is between 1.2 times and 2 times a minimum of the first and second values.

11. A transistor arrangement, comprising:
a plurality of first semiconductor regions of a first doping type and a plurality of second semiconductor regions of a second doping type, wherein the first semiconductor regions and the second semiconductor regions are arranged alternatingly in a vertical direction of a semiconductor body;
a source region adjoining the plurality of first semiconductor regions;
a drain region adjoining the plurality of second semiconductor regions and arranged spaced apart from the source region in a first lateral direction; and
a plurality of gate regions, each of the plurality of gate regions adjoining at least one of the plurality of second semiconductor regions and being arranged between the source region and the drain region,
wherein at least one of the first and second semiconductor regions has a doping dose that varies in the first lateral direction, and
wherein a remainder of the first and second semiconductor regions each has an essentially homogenous doping dose,
wherein the plurality of first semiconductor regions and the plurality of second semiconductor regions comprise an uppermost semiconductor region and a lowermost semiconductor region,
wherein the at least one of the first and semiconductor regions is spaced apart from the uppermost semiconductor region and the lowermost semiconductor region.

12. A transistor arrangement, comprising:
a plurality of first semiconductor regions of a first doping type and a plurality of second semiconductor regions of a second doping type, wherein the first semiconductor regions and the second semiconductor regions are arranged alternatingly in a vertical direction of a semiconductor body;
a source region adjoining the plurality of first semiconductor regions;
a drain region adjoining the plurality of second semiconductor regions and arranged spaced apart from the source region in a first lateral direction; and
a plurality of gate regions, each of the plurality of gate regions adjoining at least one of the plurality of second semiconductor regions and being arranged between the source region and the drain region,
wherein at least one of the first and second semiconductor regions has a doping dose that varies in the first lateral direction, and
wherein a remainder of the first and second semiconductor regions each has an essentially homogenous doping dose, wherein the plurality of the first and second semiconductor regions comprises an adjoining semiconductor region adjoining the at least one of the first and semiconductor regions, wherein the adjoining semiconductor region has a homogenous doping dose lower than a homogenous doping dose of at least one other of the first and second semiconductor regions that is spaced apart from the at least one of the first and semiconductor regions.

* * * * *